(12) United States Patent
Pearce

(10) Patent No.: US 7,927,940 B2
(45) Date of Patent: Apr. 19, 2011

(54) METHOD OF MANUFACTURING A LATERALLY DIFFUSED METAL OXIDE SEMICONDUCTOR DEVICE

(75) Inventor: Charles W. Pearce, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/555,082

(22) Filed: Sep. 8, 2009

(65) Prior Publication Data

US 2009/0325353 A1    Dec. 31, 2009

Related U.S. Application Data

(62) Division of application No. 09/755,826, filed on Jan. 4, 2001.

(60) Provisional application No. 60/174,566, filed on Jan. 5, 2000.

(51) Int. Cl.
*H01L 21/336* (2006.01)

(52) U.S. Cl. ........ 438/197; 438/286; 438/301; 438/585; 257/E21.417

(58) Field of Classification Search ............... 438/197, 438/585, 286, 301; 257/E21.417
See application file for complete search history.

(56) References Cited

U.S. PATENT DOCUMENTS

| | | | |
|---|---|---|---|
| 4,173,818 A * | 11/1979 | Bassous et al. | 438/286 |
| 4,918,026 A | 4/1990 | Kosiak et al. | |
| 5,841,166 A | 11/1998 | D'Anna et al. | |
| 6,255,154 B1 | 7/2001 | Akaishi et al. | |
| 2001/0051400 A1 | 12/2001 | Pearce | |

* cited by examiner

*Primary Examiner* — Jack Chen

(57) ABSTRACT

A method of manufacturing a laterally diffused metal oxide semiconductor (LDMOS) device, and an integrated circuit associated therewith. The method includes forming a lightly-doped source/drain region with a first dopant, the lightly-doped source/drain region located between first and second isolation structures. The method further includes creating a gate over the lightly-doped source/drain region. In one advantageous embodiment of the present invention, the method further includes diffusing a second dopant at least partially across the lightly-doped source/drain region and under the gate to form a first portion of a channel.

15 Claims, 6 Drawing Sheets

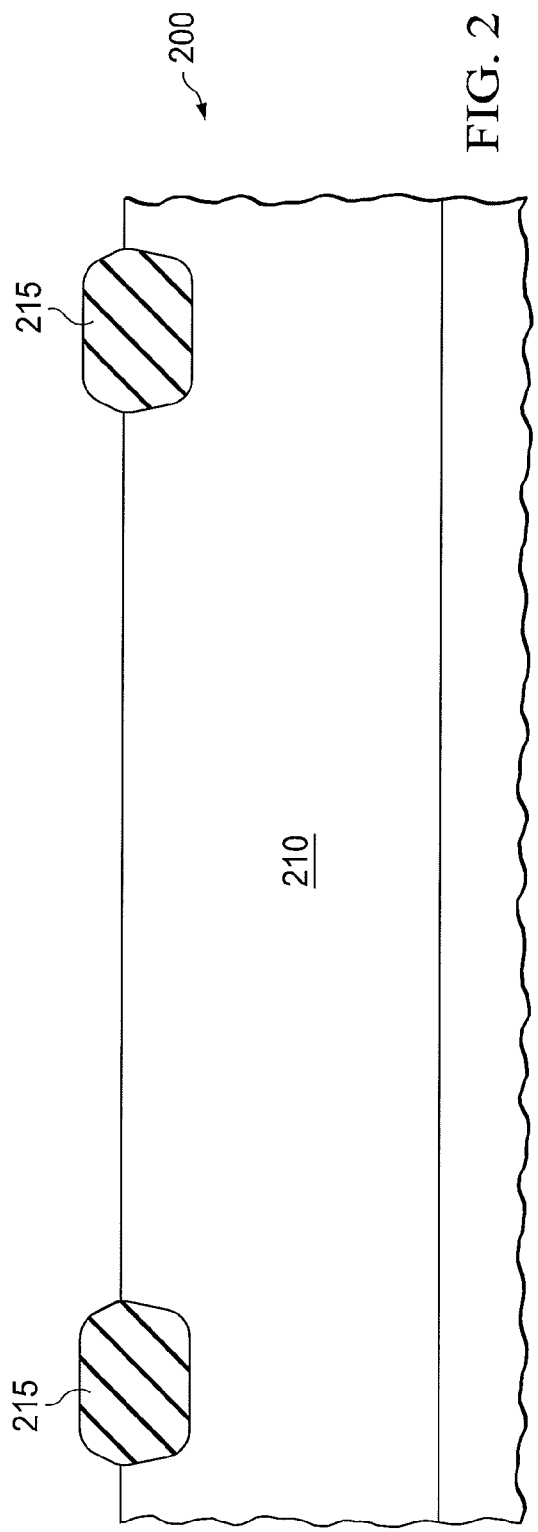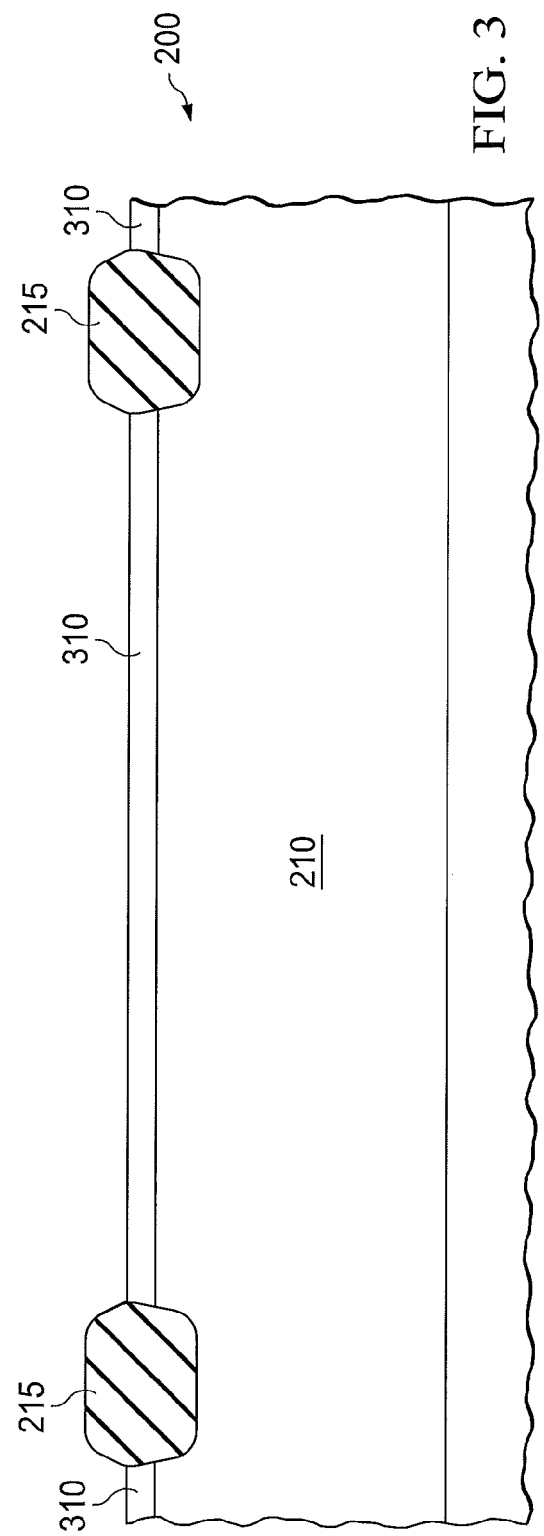

METHOD OF MANUFACTURING A LATERALLY DIFFUSED METAL OXIDE SEMICONDUCTOR DEVICE

CROSS-REFERENCE TO PROVISIONAL APPLICATION

This Application is a Divisional of U.S. application Ser. No. 09/755,826 filed on Jan. 4, 2001, to Charles W. Pearce, entitled "A METHOD OF MANUFACTURING A LATERALLY DIFFUSED METAL OXIDE SEMICONDUCTOR DEVICE," currently pending; which claims the benefit of U.S. Provisional Application No. 60/174,566, entitled "INTEGRATED CIRCUIT AND A METHOD OF MAKING AN INTEGRATED CIRCUIT," to Charles Walter Pearce, filed on Jan. 5, 2000, which is commonly assigned with the present invention and incorporated herein by reference as if reproduced herein in its entirety.

TECHNICAL FIELD OF THE INVENTION

The present invention is directed, in general, to a semiconductor device and, more specifically, to a method of manufacturing a laterally diffused metal oxide semiconductor (LDMOS) device and an integrated circuit associated therewith.

BACKGROUND OF THE INVENTION

Power semiconductor devices are currently being used in many applications, either as discrete components or integrated with other transistors as an integrated circuit. Such power devices include high-voltage integrated circuits which typically include one or more high-voltage transistors, often on the same chip as low-voltage circuitry. A commonly used high-voltage component for these circuits is a laterally diffused metal oxide semiconductor (LDMOS) transistor. High-power applications have called for the use of such lateral double diffused MOS transistors primarily because they possess lower "on" resistance, $R_{DS}$ (on), faster switching speed, and lower gate drive power dissipation than their bipolar counterparts. However, these devices have heretofore also been strongly associated with bi-polar based process flows when integrated into a Bi-CMOS environment.

LDMOS transistors used in the high-voltage integrated circuits may generally be fabricated using some of the same techniques used to fabricate low voltage circuitry or logic circuitry. In general, LDMOS structures are fabricated in a thick epitaxial layer of the same or opposite conductivity type as the substrate. The epitaxial layer helps to equally distribute the applied drain voltage laterally across the silicon surface.

Typically, in a step subsequent to the formation of the epitaxial layer, a gate structure is formed over the epitaxial layer and a drain region dopant is laterally diffused under the gate structure. Diffusing the drain region dopant generally requires a masking step that masks all regions of the device except for the drain region and the gate structure. In addition to laterally diffusing the drain region dopant, a source region dopant is laterally diffused under the other side of the gate structure. An additional masking step, similar to the masking step previously described, is also required when laterally diffusing the source region dopant. Subsequent to laterally diffusing the source and drain region dopants, a higher concentration dopant may be diffused within the device. The previously described method of manufacturing an LDMOS device is extensively used and well accepted, however, it may be very time consuming and costly. More specifically, it is known that the multiple masking steps required to laterally diffuse the source and drain region dopants may be time consuming and costly.

Accordingly, what is needed in the art is a method of manufacturing an LDMOS device that does not experience the time and cost issues associated with the prior art methods of manufacturing LDMOS devices.

SUMMARY OF THE INVENTION

To address the above-discussed deficiencies of the prior art, the present invention provides a method of manufacturing a laterally diffused metal oxide semiconductor (LDMOS) device, and an integrated circuit associated therewith. The method includes forming a lightly-doped source/drain region with a first dopant, the lightly-doped source/drain region located between first and second isolation structures. The method further includes creating a gate over the lightly-doped source/drain region. In one advantageous embodiment of the present invention, the method further includes diffusing a second dopant at least partially across the lightly-doped source/drain region and under the gate to form a first portion of a channel.

The present invention therefore introduces a method for manufacturing an LDMOS device, which does not experience many of the time and cost issues associated with the prior art LDMOS devices. More specifically, using the present method, the LDMOS may be manufactured using a reduced number of costly masking steps.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGUREs. It is emphasized that in accordance with the standard practice in the semiconductor industry the various features are not drawn to scale. In fact, the dimensions of the various features may be arbitrarily increased or reduced for clarity of discussion. Reference is now made to the following descriptions taken in conjunction with the accompanying drawings, in which:

FIG. 2 illustrates a partially completed LDMOS device including a semiconductor substrate;

FIG. 3 illustrates the partially completed LDMOS device illustrated in FIG. 2, after forming a lightly-doped source/drain region using a first dopant;

DETAILED DESCRIPTION

Figure 1:
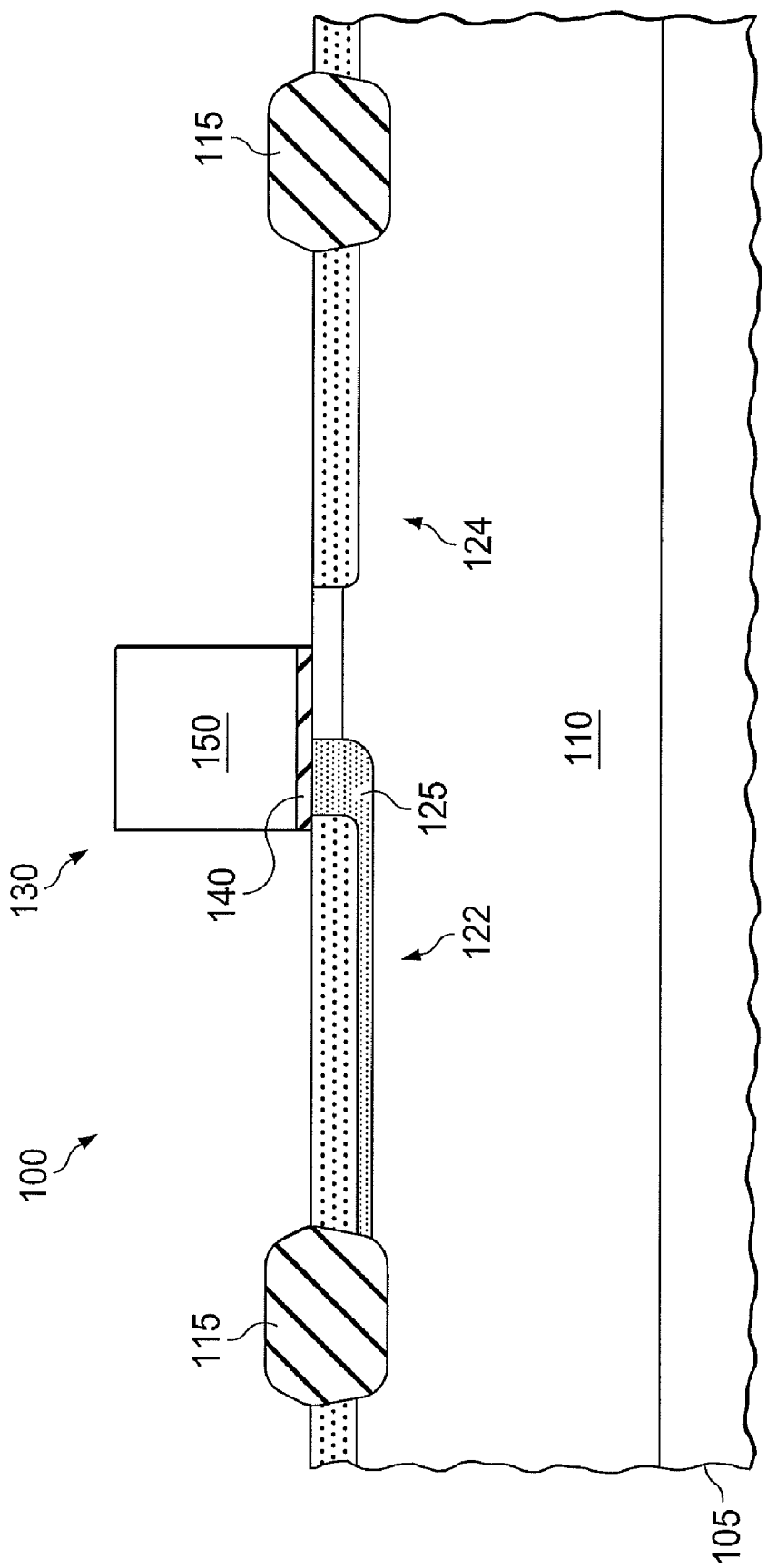
FIG. 1 illustrates a cross-sectional view of a completed LDMOS device manufactured by the method described herein.

Referring initially to FIG. 1, illustrated is a cross-sectional view of a completed laterally diffused metal oxide semiconductor (LDMOS) device 100 manufactured by the method described herein. The LDMOS device 100 includes a semiconductor wafer 105, a semiconductor substrate 110, first and second isolation structures 115 and source and drain regions 122, 124, respectively. The LDMOS device 100 further includes a first portion of a channel 125. Further included in the LDMOS device 100 is a gate 130, including a gate oxide 140 and poly gate 150. It should be noted that the semiconductor substrate 110 may be any layer located in the LDMOS device 100, including the semiconductor wafer 105 or a layer located above the semiconductor wafer 105.

The LDMOS device 100 manufactured according to the method described below does not experience the time and expense issues associated with an LDMOS device 100 manufactured using prior art methods. More specifically, the LDMOS device 100 may be manufactured using less semiconductor masking steps than used in the prior art processes. Moreover, the method is easy to adapt to the current manufacturing process and is scalable to smaller dimension devices.

Turning to FIGS. 2-6, illustrated are various stages of manufacture of the completed LDMOS device 100 illustrated in FIG. 1. FIG. 2 illustrates a partially completed LDMOS device 200, including a semiconductor substrate 210. Located within the semiconductor substrate 210 are first and second isolation structures 215, formed in a prior step not shown. As illustrated, the isolation structures are field oxides, however, it should be noted that any known or hereinafter discovered isolation structure 215 could be used. Depending on whether the partially completed LDMOS device 200 is going to be a laterally diffused P-type metal oxide semiconductor (LDPMOS) device or a laterally diffused N-type metal oxide semiconductor (LDNMOS) device, the semiconductor substrate 210 is conventionally doped with phosphorous or boron, respectively. As illustrated, the semiconductor substrate 210 is a P-type doped semiconductor substrate.

Turning to FIG. 3, illustrated is the partially completed LDMOS device 200 illustrated in FIG. 2, after forming a lightly-doped source/drain region 310 using a first dopant. As illustrated, the lightly-doped source/drain region 310 is located between the first and second isolation structures 215. In an exemplary embodiment of the present invention, the lightly-doped source/drain region 310 is achieved by a blanket implant (i.e., no masking steps required) over the entire semiconductor substrate 210. In contrast to the prior art, the lightly-doped source/drain region 310 is formed prior to a gate formation.

In the illustrative embodiment where the semiconductor substrate 210 is a p-type semiconductor substrate, the first dopant is an N-type dopant, such as phosphorous. It should be noted, however, that the inverse also holds true, and is within the scope of the present invention. It is desired for the lightly-doped source/drain region 310 to have an implant dose ranging from about 1E12 atoms/cm$^2$ to about 1E13 atoms/cm$^2$, however, in an exemplary embodiment of the present invention the lightly-doped source/drain region 310 has an implant dose of about 5E12 atoms/cm$^2$. In an exemplary embodiment of the present invention, the lightly-doped source/drain region has a depth of about 3000 nm.

Figure 4:
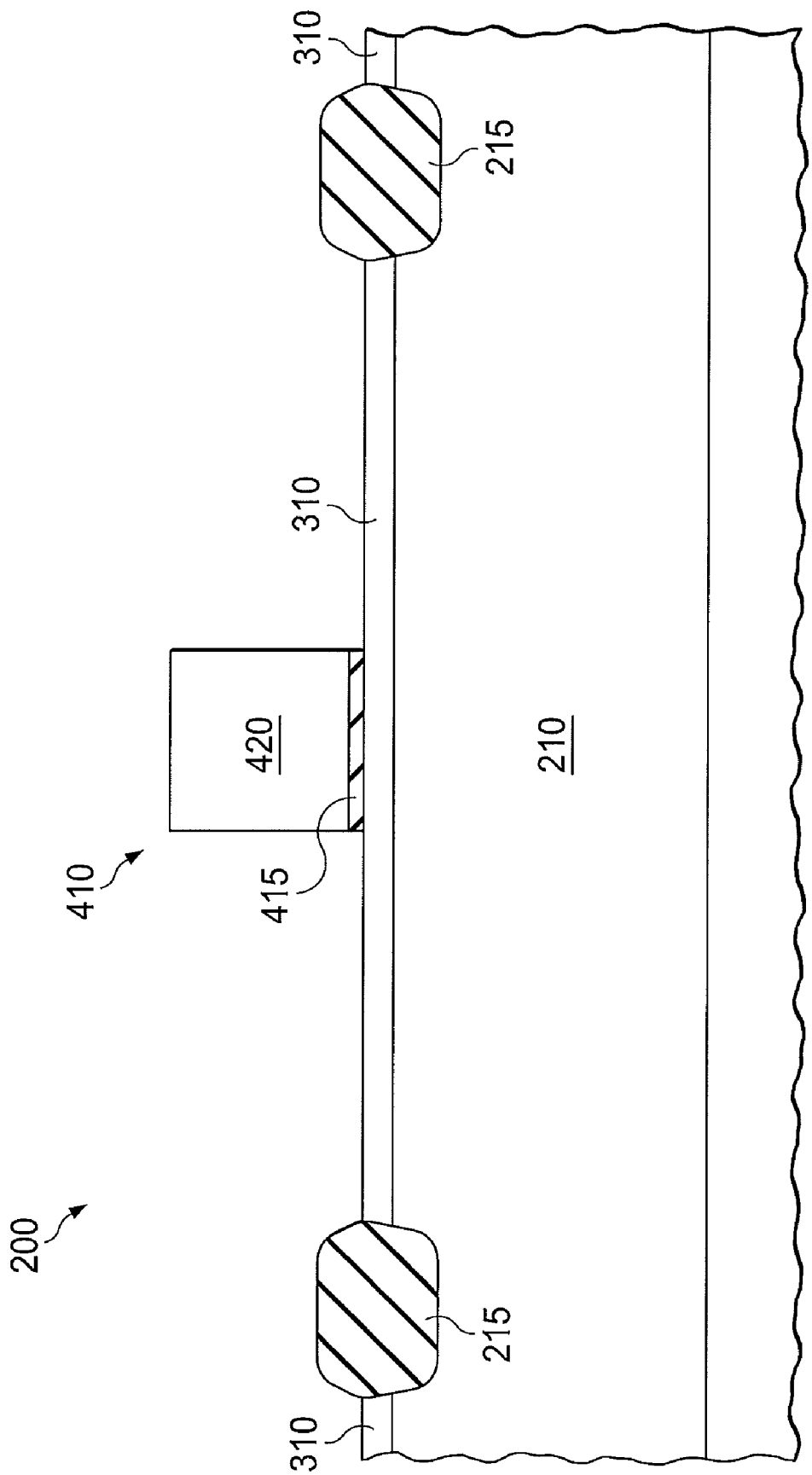
FIG. 4 illustrates the partially completed LDMOS device illustrated in FIG. 3, after formation of a conventional gate, including a gate oxide and poly gate.

Turning now to FIG. 4, illustrated is the partially completed LDMOS device 200 illustrated in FIG. 3, after formation of a conventional gate 410, including a gate oxide 415 and poly gate 420. Forming the gate 410 uses many conventional processes known to those skilled in the art, including forming a blanket gate oxide layer and a blanket poly gate layer, depositing and patterning photoresist over the blanket poly gate layer, and etching those areas unprotected by photoresist to form the gate 410. Since many of the methods used to form the gate 410 are conventional, many of the other details regarding the formation of the gate 410 have been omitted.

Figure 5:
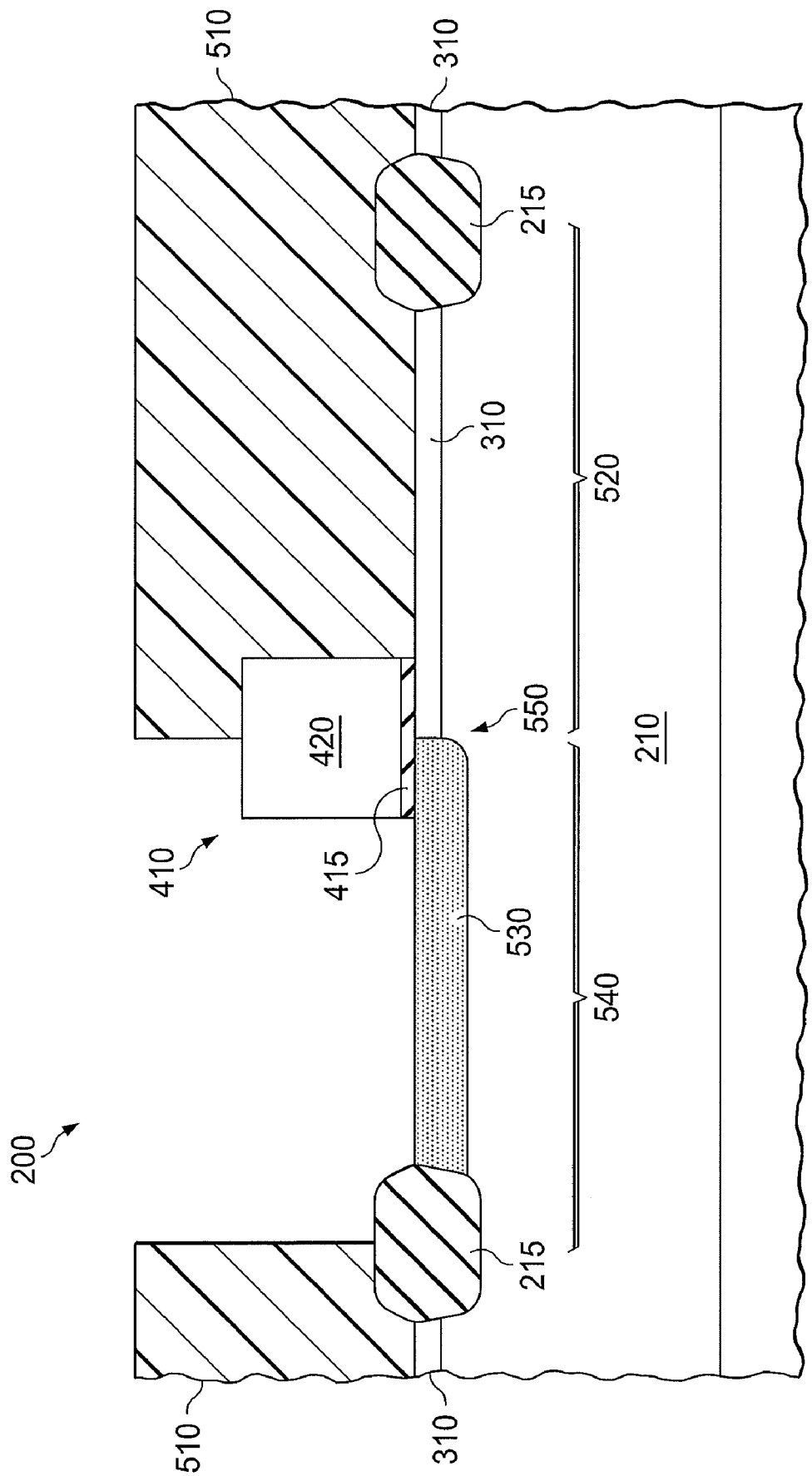
FIG. 5 illustrates the partially completed LDMOS device illustrated in FIG. 4, including a photoresist portion located over a portion of the gate and a drain side of the LDMOS device, and the final portion of a second dopant after diffusion.

Turning to FIG. 5, illustrated is the partially completed LDMOS device 200 illustrated in FIG. 4, including a photoresist portion 510 located over a portion of the gate 410, and a drain side 520 of the LDMOS device 200, and the final portion of a second dopant 530 after diffusion. One having skill in the art knows that to form the photoresist portion 510, a layer of photoresist material is conventionally deposited over the surface of the LDMOS device 200, patterned by exposing certain portions of the photoresist layer to radiation, and washed leaving the photoresist portion 510.

After formation of the photoresist portion 510, the second dopant 530 may be diffused within an unprotected region (e.g., a source side 540 of the LDMOS device 200), and at least partially across the lightly-doped source/drain region 310. As illustrated, a portion of the second dopant may diffuse under the gate 410, forming a first portion of the channel 550. In the situation described above where the lightly-doped source/drain region 310 includes a first N-type dopant, the second dopant 530 may comprise a P-type dopant. In an exemplary embodiment, the second dopant 530 has an implant dose ranging from about 1E13 atoms/cm$^2$ to about 1E14 atoms/cm$^2$. It should be noted, however, that the implant dose may vary, but should be about 100 times higher than the implant dose of the first dopant.

Figure 6:
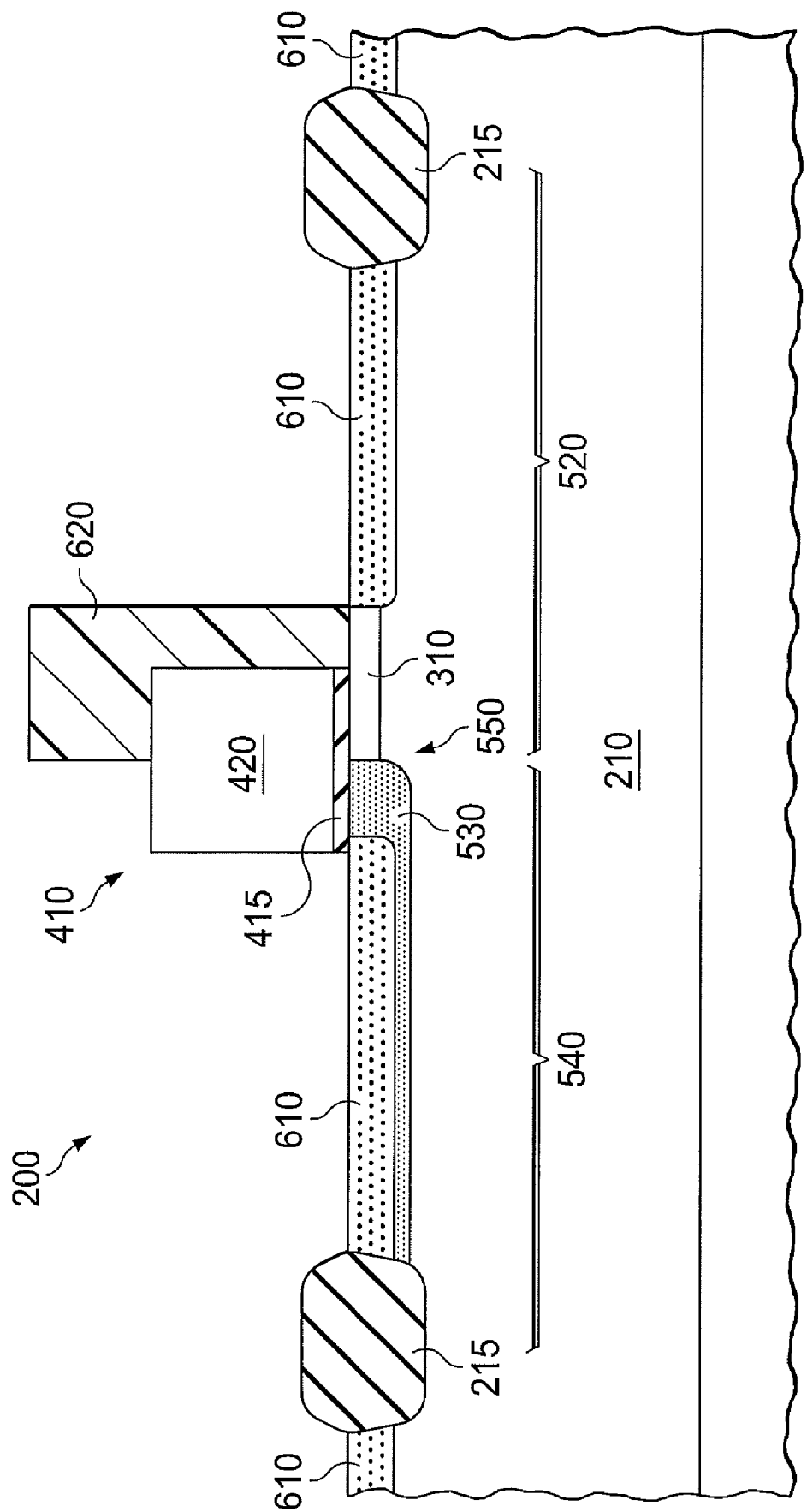
FIG. 6 illustrates the partially completed LDMOS device illustrated in FIG. 5, after placing a heavy concentration of the first dopant in a region adjacent a source side of the gate, and in the lightly-doped source/drain region adjacent a drain side of the gate.

Turning to FIG. 6, illustrated is the partially completed LDMOS device 200 illustrated in FIG. 5, after placing a heavy concentration of the first dopant 610 in a region adjacent the source side 540 of the gate 410, and in the lightly-doped source/drain region 310 adjacent the drain side 520 of the gate 410. As illustrated, a photoresist portion 620 may be formed over a portion of the gate 410 and a portion of the drain side 520 of the gate 410, prior to diffusing the heavy concentration of the first dopant 610. In such an instance, the heavy concentration of the first dopant 610 is placed in the lightly-doped source/drain region 310 a distance ranging from about 2000 nm to about 3000 nm from the drain side 520 of the gate 410. In an exemplary embodiment the heavy concentration 610 has an implant dose ranging from about 1E15 atoms/cm$^2$ to about 1E16 atoms/cm$^2$. After removing the photoresist portion 620, a device, similar to the LDMOS device 100 illustrated in FIG. 1, is achieved.

Figure 7:
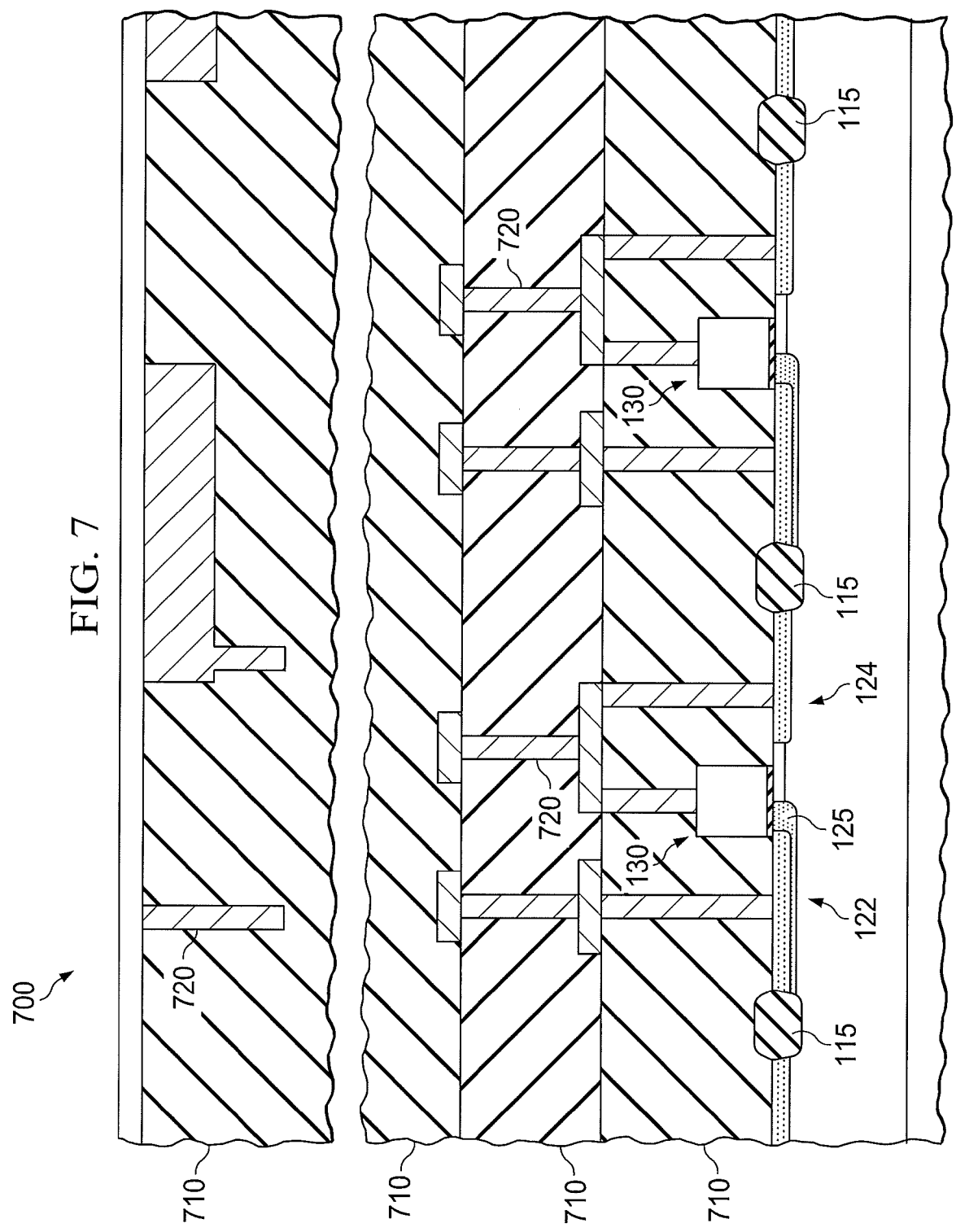
FIG. 7 illustrates a completed integrated circuit, which represents one environment in which the previously described method of manufacturing a LDMOS device could be used.

Turning briefly to FIG. 7, with continued reference to FIG. 1, illustrated is a completed integrated circuit 700, which represents one environment in which the previously described method of manufacturing a LDMOS device 100 could be used. The integrated circuit 700 may include laterally diffused metal oxide semiconductor (LDMOS) devices, traditional CMOS devices, bipolar CMOS (BiCMOS) devices, dynamic random access memory (DRAM) devices, electrically erasable programmable read-only memory (EEPROM) devices, including Flash EEPROMs, or any other type of similar device. Also shown in one advantageous embodiment of the integrated circuit 700, are components of the integrated circuit 700, including: isolation structures 115, the source region 122, the drain region 124, the channel 125, and the gate 130. Also included in the completed integrated circuit 700 are dielectric layers 710, and interconnect structures 720 located within the dielectric layers 710, connecting the LDMOS devices 100 to form an operational integrated circuit 700.

Although the present invention has been described in detail, those skilled in the art should understand that they can make various changes, substitutions and alterations herein without departing from the spirit and scope of the invention in its broadest form.

What is claimed is:

1. A method of manufacturing an integrated circuit, comprising:
    forming first and second isolation structures over a substrate;
    fabricating laterally diffused metal oxide semiconductor (LDMOS) transistors, including:
        forming a lightly-doped source/drain region with a first dopant within the substrate, the lightly-doped source/drain region located between the first and second isolation structures; and
        creating a gate over the lightly-doped source/drain region;
        diffusing a second dopant at least partially across the lightly-doped source/drain region and under the gate to form a first portion of a channel;
        placing a heavy concentration of the first dopant in a region adjacent the second dopant proximate a source side of the gate, and in the lightly-doped source/drain region adjacent a drain side of the gate;
    depositing interlevel dielectric layers over the LDMOS transistors; and
    creating interconnect structures in the interlevel dielectric layers and interconnecting the LDMOS transistors to form an operative-integrated circuit.

2. The method as recited in claim 1 wherein forming includes forming a lightly-doped source/drain region with a first N-type dopant.

3. The method as recited in claim 2 wherein the first N-type dopant has an implant dose ranging from about 1E12 atoms/cm² to about 1E13 atoms/cm².

4. The method as recited in claim 1 wherein diffusing the second dopant includes diffusing a second P-type dopant having an implant dose ranging from about 1E13 atoms/cm² to about 1E14 atoms/cm².

5. The method as recited in claim 1 wherein diffusing the second dopant includes diffusing a second P-type having an implant dose about 100 times higher than an implant dose of the first dopant.

6. The method as recited in claim 1 wherein placing includes placing an implant dose of the first dopant ranging from about 1E15 atoms/cm² to about 1E16 atoms/cm².

7. The method as recited in claim 1 wherein forming the lightly-doped source/drain region includes forming the lightly-doped source/drain region using a blanket implant process over the entire substrate.

8. The method as recited in claim 1 wherein the heavy concentration of the first dopant in the lightly-doped source/drain region adjacent the drain side of the gate is offset from a sidewall of the gate.

9. The method as recited in claim 8 wherein the offset ranges from about 2000 mnm to about 3000 nm.

10. The method as recited in claim 8 further including forming a photoresist portion over a portion of the gate and a portion of the drain side of the gate to create the offset.

11. A method of manufacturing a laterally diffused metal oxide semiconductor (LDMOS) device, comprising:
    forming first and second isolation structures within a substrate, the first isolation structure having a first edge and a second edge and the second isolation structure having a third edge and a fourth edge;
    forming a lightly-doped source/drain region between the first and second isolation structures with only a first dopant, the lightly-doped source/drain region in contact with the second edge of the first isolation structure and the third edge of the second isolation structure; and
    creating a gate over the lightly-doped source/drain region and between the first and second isolation structures;
    diffusing a second opposite dopant at least partially across the lightly-doped source/drain region and under the gate to form a first portion of a channel; and
    placing a heavy concentration of the first dopant in a region adjacent the second dopant proximate a source side of the gate, and in the lightly-doped source/drain region adjacent a drain side of the gate.

12. The method as recited in claim 11 wherein the first and second isolation structures are first and second field oxide isolation structures.

13. The method as recited in claim 11 wherein the heavy concentration of the first dopant in the lightly-doped source/drain region adjacent the drain side of the gate is offset from a sidewall of the gate.

14. The method as recited in claim 13 wherein the offset ranges from about 2000 nm to about 3000 nm.

15. The method as recited in claim 13 further including forming a photoresist portion over a portion of the gate and a portion of the drain side of the gate to create the offset.

* * * * *